US005740600A

United States Patent [19]
Rasberry

[11] Patent Number: 5,740,600
[45] Date of Patent: Apr. 21, 1998

[54] ELECTRIC MOTOR STATOR WINDING BONDING APPARATUS AND METHOD THEREFORE

[75] Inventor: Tom H. Rasberry, Kennett, Mo.

[73] Assignee: Emerson Electric Co., St. Louis, Mo.

[21] Appl. No.: 533,752

[22] Filed: Sep. 26, 1995

[51] Int. Cl.$^6$ .................................................. H02K 15/04
[52] U.S. Cl. ........................ 29/596; 29/605; 29/705; 29/709; 29/732; 156/169; 156/274.2; 156/379.6; 324/546; 324/772
[58] Field of Search .......................... 29/596, 605, 709, 29/732, 705; 324/546, 772; 156/64, 169, 172, 274.2, 379.6

[56] References Cited

U.S. PATENT DOCUMENTS

| 3,676,814 | 7/1972 | Trunzo et al. ............... 156/169 X |
| 4,087,712 | 5/1978 | Mosimann et al. ............ 29/605 X |
| 4,388,371 | 6/1983 | Bolon et al. ................ 156/169 X |
| 4,436,988 | 3/1984 | Blumenkranz ................ 156/169 X |
| 5,412,362 | 5/1995 | Ikeuchi ...................... 29/605 X |
| 5,547,532 | 8/1996 | Wernerbach, Jr. et al. ...... 29/605 X |

Primary Examiner—S. Thomas Hughes
Attorney, Agent, or Firm—Polster, Lieder, Woodruff & Lucchesi

[57] ABSTRACT

Apparatus (10) and method for bonding together coils of an electrical wire forming windings (W) of a stator assembly (54) employed in making an electric motor. The apparatus includes a fixture (22) on which the stator assembly is installed during a bonding operation, the fixture also holding the stator assembly during a surge test which precedes the bonding operation. Electrical connectors (38) are used to electrically connect the stator windings to the apparatus, and these electrical connections are used for both the surge test and the bonding operation. A power supply unit (16) is responsive to an indication that the stator windings have successfully passed a surge test to apply a predetermined voltage to the windings. The current flowing through the stator windings as a result of the applied voltage is measured. A bonding control unit (50) controls the bonding operation. The control unit calculates the winding resistance as a function of the applied voltage and measured current, and adjusts the applied voltage to a level at which a predetermined current flows through the windings. This current heats the windings to a temperature at which a temperature activated adhesive material applied to the wires is activated. The material, when so activated, bonds the wires together.

33 Claims, 3 Drawing Sheets

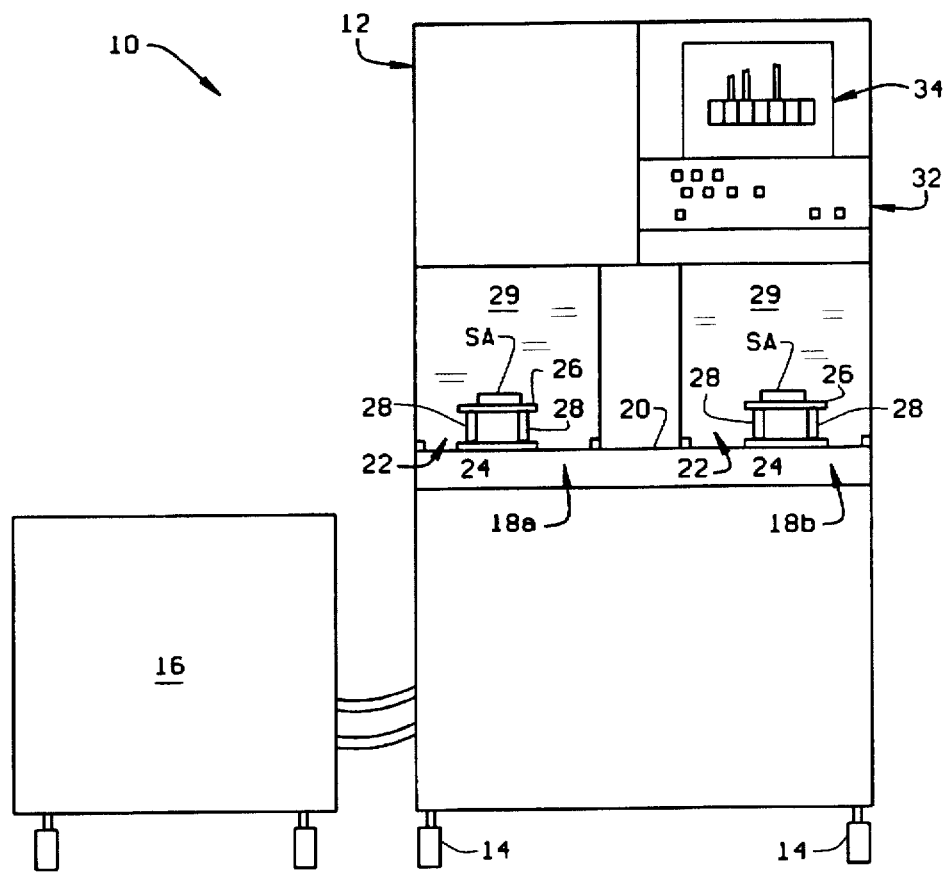
FIG. 1
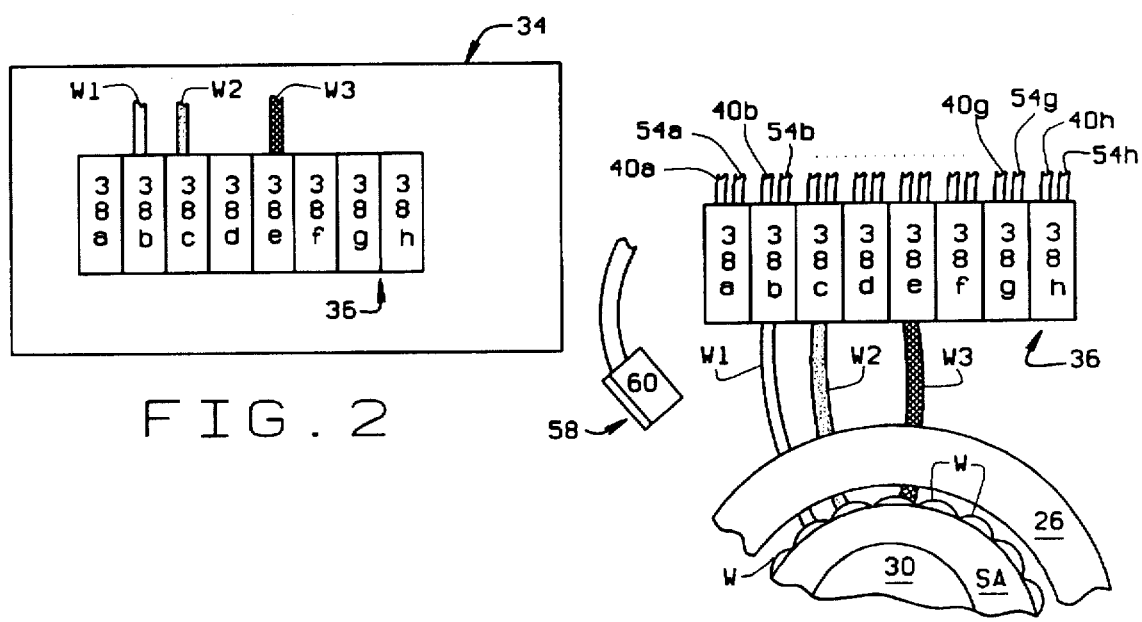
FIG. 2
FIG. 3

ELECTRIC MOTOR STATOR WINDING BONDING APPARATUS AND METHOD THEREFORE

BACKGROUND OF THE INVENTION

This invention relates to the fabrication of dynamoelectric machines such as electric motors, and more particularly, to a bonding apparatus for automatically bonding together wires comprising stator windings, after the wires have been electrically tested.

One step in the construction of an electric motor is fabrication of the motor's stator assembly. Part of this process involves installation of stator windings onto a stator assembly and electrical testing of the windings once they are installed. The motor may, for example, include a main and an auxiliary winding; although those skilled in the art will appreciate that there are a wide variety of motor constructions having a number of different winding configurations. The windings are comprised of electrical wiring which is wound into respective stator coils and inserted into respective slots formed in a stack of stator laminations. As a further step in the process, the stator assembly, including the windings are installed in an electrical test fixture. There, they are subjected to an electrical test to determine if they can withstand surges of electrical energy which greatly exceed that to which they would normally be subjected during motor usage.

If the stator windings pass the surge test, a next manufacturing step is bonding the wires comprising the stator coils together. Previously, this bonding was accomplished by applying a varnish to the windings. However, there were a number of problems associated with this. First, the varnish produces volatile emissions which cause environmental problems. Second, the direct labor costs involved to move the stator assemblies from the surge test fixture to a varnish applying station, and then to a drying facility, adds to the overall cost of the motor. Third, the resultant work-in-process (WIP) inventory can be quite high.

Now, a new type of wire is being used for stator coil construction. During manufacture of this new wire, a heat sensitive adhesive is applied to the exterior of the wire. When heated to an appropriate temperature, the adhesive is activated and this allows the coils of wire comprising a winding to adhere or bond to one another. With this new wire, it is only necessary that a heating step be performed after the stator windings have successfully passed the electrical tests. This eliminates the environmental concerns and reduces both labor cost and WIP inventory. However, heretofore, it has still been necessary to move the stator assembly from the surge facility to a bonding facility which means that unnecessary labor is still being expended.

SUMMARY OF THE INVENTION

Among the several objects of the present invention may be noted the provision of apparatus for bonding together wires comprising stator windings of a motor stator;

the provision of such apparatus for performing such a bonding operation after the stator windings have been subjected to, and passed, an electrical surge test;

the provision of such apparatus to perform the bonding operation with the stator assembly still installed in the same fixture where the surge test is performed;

the provision of such apparatus to quickly and efficiently perform the bonding operation once an acceptance indication has been provided that the stator windings have successfully passed the surge test;

the provision of such apparatus to perform such operation with the stator winding connections not having to be changed from their hook-up for the surge test;

the provision of such apparatus to perform a bonding operation on one stator while a surge test is simultaneously being performed on another winding so more than one stator can be tested and bonded at a time thereby speeding up production;

the provision of such a method of performing wire bonding in which an initial voltage and current are applied to a winding, a winding resistance value measured, and the voltage applied adjusted so a predetermined current flows through the winding;

the provision of such a method in which the predetermined current flow through the winding heats the winding to a temperature sufficient to activate an adhesive material which bonds the wires comprising the stator windings together;

the provision of such a method in which a wiring failure which occurs during the bonding process is readily detected so the stator is rejected for further use in motor construction;

the provision of such a method and apparatus in which stator assemblies can be surge tested and bonded within in a very short period of time so a large number of stator assemblies can be tested and bonded for large production rims; and, the provision of such a method and apparatus which reduces labor costs for motor manufacture while providing a tested, bonded stator assembly for use in a motor.

In accordance with the invention, generally stated, an apparatus is for bonding together coils of an electrical wire forming windings of a stator assembly employed in the construction of a dynamoelectric machine. The bonding is done after an electrical surge test on the windings has been performed. The stator assembly is installed on a fixture which is also used to hold the stator assembly during the surge test which precedes the bonding operation. The stator windings are electrically connected to the apparatus, with the same electrical connections being made for both the surge test and the bonding operation. A power supply unit is responsive to an indication that the windings of a stator assembly installed in the fixture have successfully passed a surge test to apply a predetermined voltage to the windings. Current flow through the stator windings as a result of the applied voltage is measured. A control unit calculates the resistance in the windings as a result of the applied voltage and measured current, and adjusts the applied voltage to a level at which a predetermined current flows through the windings. This current heats the windings to a temperature at which a temperature activated adhesive material applied to the wires is activated. The material, when so activated, bonds the wires together. A method of performing a bonding operation is also described. Other objects and features will be in part apparent and in part pointed out hereinafter.

BRIEF DESCRIPTION OF THE DRAWINGS

FIG. 1 is a front elevational view of a test fixture in which electrical surge testing of a stator assembly and subsequent bonding of an acceptable assembly is performed;

FIG. 2 is a screen display illustrating wiring connections to be made between the test fixture and the windings of a stator for surge testing and bonding;

FIG. 3 is plan view of the surge test and bonding fixture illustrating how the electrical connections between the apparatus and a stator are made;

Corresponding reference characters indicate corresponding parts throughout the drawings.

DESCRIPTION OF A PREFERRED EMBODIMENT

Figure 4:
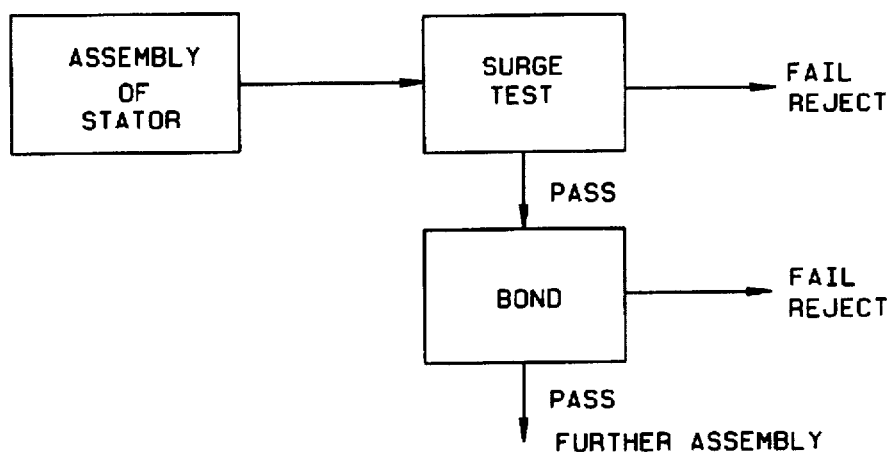
FIG. 4 is a flow chart illustrating the test sequence for first surge testing a stator and then bonding an acceptable stator.

Referring to the drawings, apparatus of the present invention is indicated generally 10. Apparatus 10 is for bonding together coils of an electrical wire forming windings W of a stator assembly SA. The stator assembly is used in a dynamoelectric machine such as an electric motor (not shown). During fabrication of a stator assembly, a stack of stator laminations are formed. Electric wire is coiled to form stator windings. The windings are then installed in the lamination stack. The resultant assembly is then subjected to a surge or high-pot test in which extremely high voltages (voltages in excess of 2,000 v.) are applied to the windings. If the windings successfully pass the test, the coils of wires are bonded together. Whereas bonding used to be done by applying a varnish to the wires, electric wires are now fabricated with a temperature activated adhesive. That is, the adhesive is normally dormant at room temperatures, but when the wire is heated to temperatures of 180° C. (356° F.) or above, the adhesive material becomes activated to bond the winding coils together. Previously, the bonding operation has been performed in a fixture separate from that in which the surge test is performed. This requires that the stator assembly be removed from the surge test fixture, conveyed to the bonding location, bonded, and then moved to the next stage in the motor assembly process.

Apparatus 10 combines the surge test and bonding operation into one unit, saving both manufacturing and testing time and attendant labor costs. In FIG. 1, apparatus 10 is shown to include a cabinet 12. The cabinet is supported on casters 14 for portability. A portable power supply unit 16 is used to supply bonding voltage to a set of stator windings being bonded. Cabinet 12 provides two surge test and bonding stations 18a and 18b. The cabinet includes a bench top 20 on which holding fixtures 22 are mounted and in which a stator assembly SA is installed. Each fixture includes a base 24 and a support ring 26 positioned above the base by posts 28. A transparent hood 29 is movable to cover the fixtures once the stator assemblies are installed.

As shown in FIG. 3, stator assembly SA has a hollow center section. The mounting fixture has a center support 30 onto which the stator assembly sets. This center support has a plurality of Hall effect sensors (not shown). The configuration of the stator windings varies depending upon the type of electric motor being constructed. The stator assembly of FIG. 3 for example, has a main winding and an auxiliary winding. As a result, there are three electrical leads W1–W3 for making electrical connections to the stator winding. Apparatus 10 includes a keyboard 32 and a visual display 34 for showing how these leads are to be connected to a connection means 36 shown in FIG. 3. Connection means 36 includes a plurality of electrical connectors 38a–38h. It will be understood that while eight connectors are shown in the drawings, connection means 36 may include more or fewer connectors.

When a stator assembly is to be surge tested, the test operator uses the keyboard to enter a code for the model of stator assembly being tested into a test controller (not shown). The test controller provides a visual indication on display 32 as to which electrical connectors the leads W1–W3 should be attached. In FIG. 2, an exemplary representation of display 34 indicates that lead W1 is connected to electrical connector 38b, lead W2 to connector 38c and lead W3 to connector 38e. Each of the electrical connectors is attached to a power supply for the surge tests. Electrical wires 40a–40h run between the respective connectors 38a–38h and the surge test power supply.

The surge test to which the windings are subjected involves the generation and application of a series of voltage pulses to the stator windings. As is well-known in the art, these pulses are short duration, high voltage pulses the peak amplitudes of which are greater than the voltage amplitudes to which the motor windings would be subjected during normal usage. The pulse width of these pulses is very short so the total energy to which the windings are subjected is small. At the end of the pulse sequence, the test results are evaluated. If the test is successful, an indication is provided by the surge test controller, and the stator assembly is passed for bonding. Otherwise, the assembly is rejected and removed from the test fixture. This is as shown in the flow chart of FIG. 4.

Figure 5:
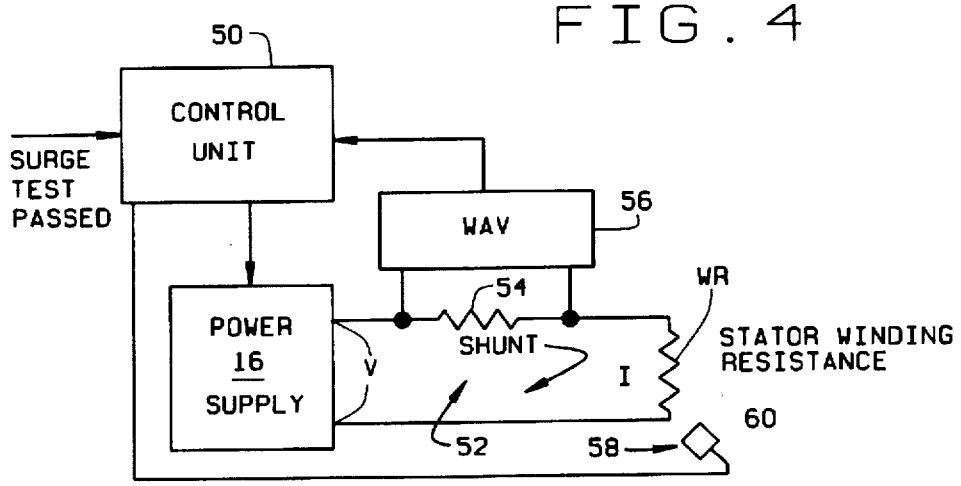
FIG. 5 is a simplified schematic of the circuitry employed to perform bonding of the stator windings.

Referring to FIG. 5, apparatus 10 is shown to further include a control unit 50 which is responsive to an indication of a successful surge test to initiate a bonding process. The control unit, upon receipt of the "pass" signal, causes power supply unit 16 to supply a predetermined initial voltage to a bonding circuit 52. Circuit 52 comprises a shunt resistor 54 connected in series with the stator windings as represented by the resistor $W_r$. This initial voltage which is, for example, 10 v. is supplied to circuit 52 via electrical wires 54a–54h. These wires are shown in FIG. 3 as attached to the same electrical connectors 38a–38h, respectively, as wires 40a–40h. This allows the bonding voltage to be supplied to the circuit 52 without having to change any of the connections previously made for the surge test.

The circuit 52 resistance R is sum of the resistance of shunt 54 and the resistance $W_r$ of the stator windings. In accordance with Ohm's law V=IR, the current I flowing through the circuit is equal to the voltage V divided by the resistance R. A measuring means 56 is provided for measuring the current. Means 56 comprises a watt-amp-voltage WAV type sensing circuit. These types of circuits are well-known in the art and operation of the circuit will not be described. It will be understood that in its present usage, only the amp and voltage sensing functions of the circuit are used. Once the current flow through the circuit is known, the control unit determines the circuit resistance. Since the shunt resistance is a known value, the balance of the circuit resistance is attributable to the stator windings.

The electric wire used to fabricate the windings has a temperature coefficient $T_c$ which is a known value. The temperature of the stator windings is readily determined using a temperature sensing means 58 which comprises an infrared sensor 60 mounted adjacent fixture 22 and oriented at the windings of a stator assembly mounted in the fixture. The stator winding temperature sensed by the infrared sensor is supplied as an input to control unit 50. Once the resistance of the stator windings has been determined, control unit 50 adjusts the output of power supply 16 to increase the voltage to a second and higher level which is, for example, on the order of 75 v. This will produce a current which is on the order of 50 amps, for example. The higher current flow through the stator windings now produces an $I^2R$ loss in the windings in which the heat generated by the current flow elevates the temperature of the wire comprising the stator windings. It will be understood that the current value selected is chosen for rapid heating of the wire to the temperature at which the adhesive is activated. If it is desired to heat the wire quicker, or more slowly, a different current value can be chosen. Regardless, the steps of supplying a first predetermined voltage, measuring the resultant current, and determining the winding resistance must still be performed in order to determine what voltage should be supplied to circuit 52 to produce the desired current flow in the circuit.

Figure 6:
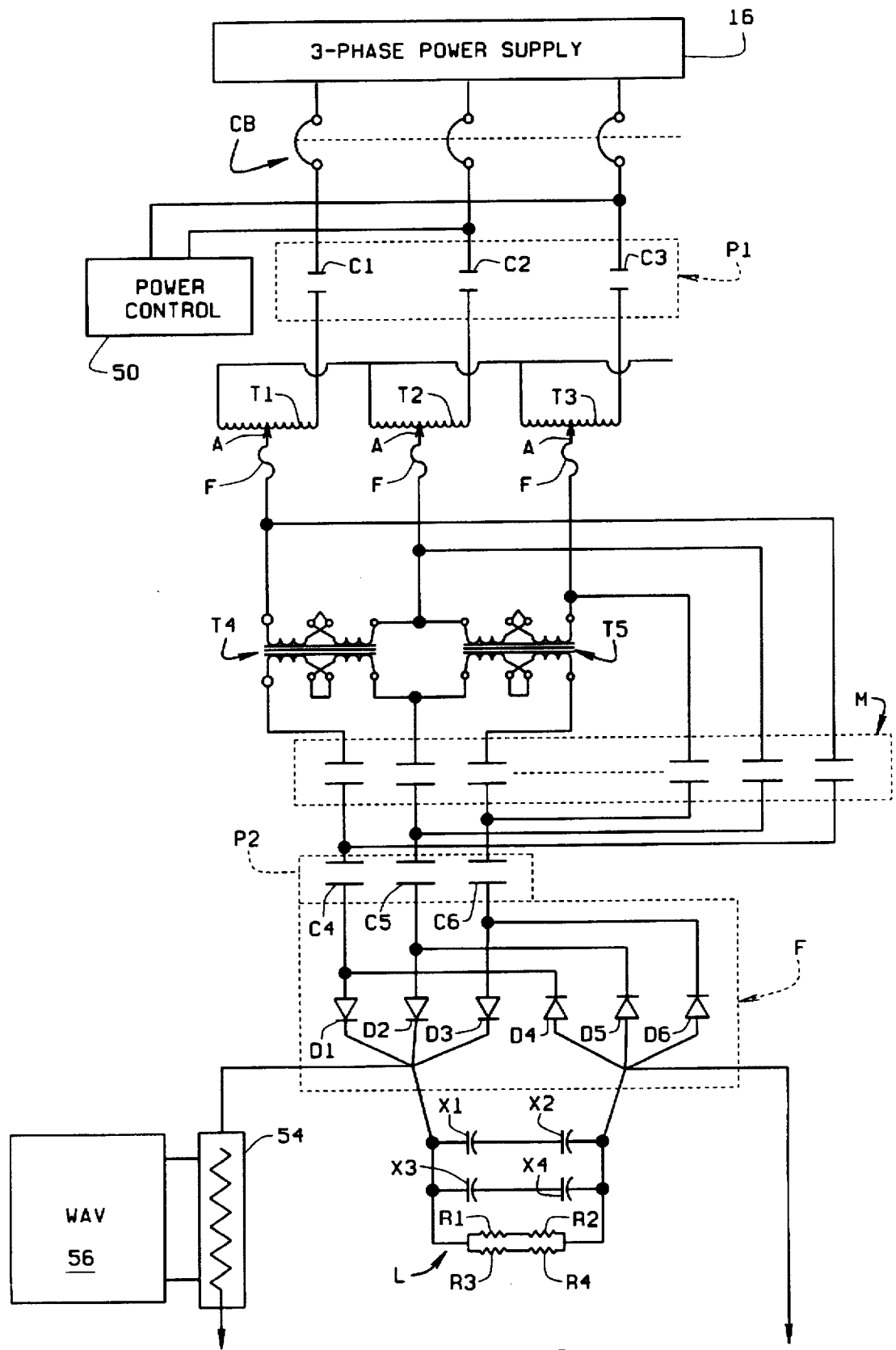
FIG. 6 is a more detailed schematic of the bonding circuitry.

Referring to FIG. 6, power supply 16 is shown to be a 3-phase power supply which is connected to a 3-phase power source through a circuit breaker CB. The respective phase voltages are applied to respective variable transformers T1–T3 through the contracts C1–C3 of a power relay P1. Each transformer T1–T3 has a movable tap A which is adjustable in response to an output from control unit 50 to increase the output voltage of the power supply from the initial predetermined value to the second voltage value which is based upon the calculated value of winding resistance. The tapped voltages are supplied through fuses F and applied to the primary windings of respective step-down transformers T4, T5. Transformers T4, T5 are 10 KV 480× 240-120 transformers, for example. The output from the transformers are routed through a mechanical interlock M and the contacts C4–C6 of a relay P2 to a 3-phase rectifier F comprised of diodes D1–D6. A filter circuit L is connected across the output of the rectifier circuit and is comprised of series-parallel connected capacitors X1–X4, and resistors R1–R4. The output from the rectifier circuit is the voltage applied to circuit 52.

Figure 7:
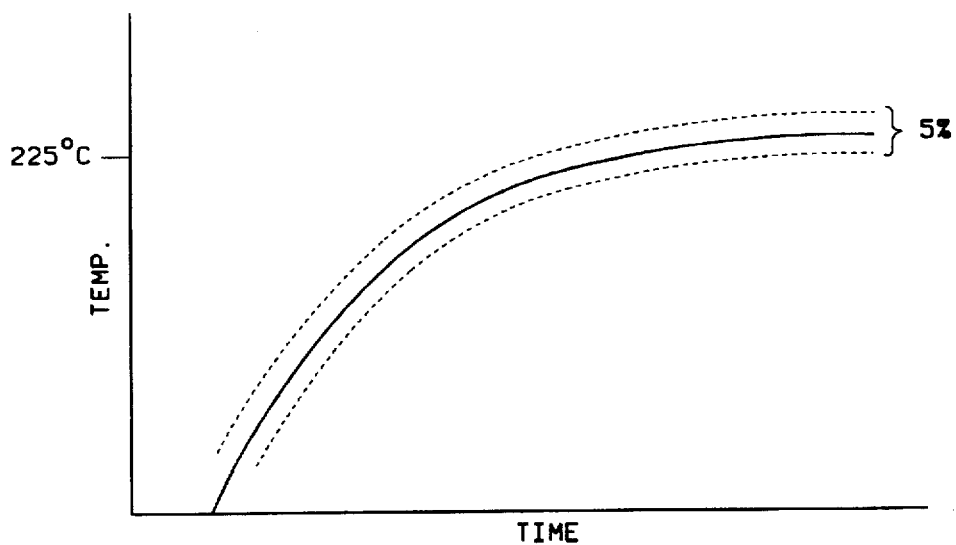
FIG. 7 is a time-temperature curve for electrical wire being bonded using the apparatus and method of the invention.

In FIG. 7, a time-temperature curve for the wire used in making the windings is shown. From an ambient or near room temperature condition, the wire temperature rapidly increases once the higher voltage is applied to the winding circuit. The manufacturer's specifications for the wire indicate that the adhesive material is activated at approximately 180° C. (356° F.). However, it has been found that the temperature at which activation actually occurs is closer to 225° C.(437° F.). This may be because of impurities in the wire, for example. Regardless, the instant the wire temperature reaches the level at which the bonding material is activated, bonding occurs. There is no need to dwell at that temperature to enhance the wire bonding. Hence, once the bonding temperature is reached, the voltage output from power supply 16 to circuit 52 can be cut-off. For control purposes, a window on either side of the time-temperature curve is monitored by the control unit. The width of this window is approximately 5% of the wire temperature. If during the heating of the wiring, the winding should fail, either as a short or as an open circuit, this will immediately be sensed by the control unit. In such instance, the bonding procedure is immediately terminated. A status of the bonding procedure is provided on display means 34.

In operation, the installation of a stator assembly in a fixture 22, connection of the wire ends to connection means 36, and performance of a surge test takes approximately 30 seconds. Performance of the subsequent bonding process also takes approximately 30 seconds. For large production runs, a stator assembly is installed in each of the fixtures 22. Now, performance of the surge tests and bonding are staggered so that as one stator assembly installed in one fixture is being bonded, a stator assembly in the other fixture is being surge tested. This staggered operation increases throughput for this part of the motor assembly operation.

Stator assembly SA is noted above, has both a main winding, and an auxiliary winding. Other stator assemblies for different types of motors may have more than two windings. Regardless, the resistance calculation made during the above described procedure is used to determine which winding has the lowest resistance. The voltage is then increased to supply the desired current level through this winding to heat it. The heat generated by the current flow through this winding is thermally transferred to the other windings to heat the wire comprising those windings to the temperature at which the adhesive is activated.

Finally, it will be understood that the surge test circuitry is completely isolated from the bonding circuitry and that, except for using the common connection means for attaching the stator wire ends to the apparatus, the only connection between the two processes is the signal from the surge tester that a stator assembly has successfully passed a surge test and bonding can commence.

What has been described is apparatus for bonding together coils of wire wound to form the stator windings of a motor stator. The apparatus is used to perform bonding of the coils after the stator windings have first been subjected to, and passed, an electrical surge test. Coils not passing the test are rejected. The bonding operation is performed with the stator assembly installed in the same fixture in which a surge test is performed. The apparatus quickly and efficiently performs the bonding operation as soon as an acceptance indication has been given that the surge test has been successfully passed. In performing the bonding operation, the stator winding connections do not have to be changed from their hook-up for the surge test. To further speed up production, one stator can be bonded while another is being surge tested. In performing the bonding operation, an initial voltage and current are applied to a winding, a winding resistance is measured, and the applied voltage adjusted so a predetermined current will flow through the windings. This current flow heats the windings to a temperature sufficient to activate an adhesive material which bonds the wires comprising the stator windings together. If a wiring failure occurs during the bonding operation, it is readily detected and the stator rejected. Use of method and apparatus of the invention reduces labor costs for motor manufacture while providing a tested, bonded stator assembly for use in a motor.

In view of the foregoing, it will be seen that the several objects of the invention are achieved and other advantageous results are obtained.

As various changes could be made in the above constructions without departing from the scope of the invention, it is intended that all matter contained in the above description or shown in the accompanying drawings shall be interpreted as illustrative and not in a limiting sense.

Having thus described the invention, what is claimed and desired to be secured by Letters Patent is:

1. Apparatus for bonding together coils of an electrical wire forming windings of a stator assembly employed in the construction of a dynamoelectric machine, after an electrical surge test on the windings has been performed, the apparatus comprising:

a fixture on which the stator assembly is installed during a wiring bonding operation, the fixture also holding the stator assembly during a surge test which precedes the bonding operation;

connector means for electrically connecting the stator windings to the apparatus, the same electrical connections being made between the windings and the connector means for both the surge test and the bonding operation;

power supply means responsive to an indication that the windings of a stator assembly installed in the fixture have successfully passed a surge test to apply a predetermined voltage to the stator windings;

means for measuring the current flowing through the stator windings as a result of the applied voltage; and, bonding control means controlling the bonding operation, said control means calculating the resistance in the windings as a result of the applied voltage and measured current, and for adjusting the applied voltage to a desired level at which a predetermined current flows through the windings to heat the windings to a temperature at which a temperature activated adhesive material applied to the wires is activated, the material, when so activated, bonding the wires together.

2. The apparatus of claim 1 wherein the power supply means provides a predetermined voltage output and the control means includes adjustment means through which the voltage output of the power supply means is routed to the stator windings, the adjustment means being responsive to the calculated winding resistance to adjust the voltage from the power supply means applied to the stator windings to the voltage which produces the predetermined current flow through the windings.

3. The apparatus of claim 2 wherein the stator assembly includes a plurality of windings and the control means adjusts the applied voltage based upon the stator winding having the lowest calculated resistance.

4. The apparatus of claim 3 wherein the power supply means provides an AC voltage output and the adjustment means includes a variable transformer having a tap controllable for the voltage developed across the transformer to be at the desired voltage level.

5. The apparatus of claim 3 wherein the connector means includes a plurality of electrical connectors to which ends of the stator windings are connected for the surge test and bonding operations.

6. The apparatus of claim 5 further including means for indicating which winding ends are to be attached to which electrical connectors based upon the type of stator assembly being tested and bonded.

7. The apparatus of claim 1 wherein the electrical wire has a known temperature coefficient and the control means applies the desired voltage to the stator windings only for a time interval required for the wire temperature to be raised to the temperature at which the adhesive material is activated, this interval being a function of the resistance of the wire and the temperature coefficient of the wire.

8. The apparatus of claim 7 further including means for sensing the temperature of the stator windings.

9. The apparatus of claim 8 wherein the temperature sensing means comprises an infrared temperature sensor.

10. The apparatus of claim 1 further including a second fixture on which a second stator assembly is installed during a second wiring bonding operation, the second fixture holding the second stator assembly during a separate surge test which precedes the second wiring bonding operation;

a second connector means for electrically connecting the windings of the second stator assembly to the apparatus, the same electrical connections being made between the windings of the second stator assembly and the second connector means for both the separate surge test and the second wiring bonding operation, and the power supply means being responsive to an indication that windings of the second stator assembly have successfully passed said separate surge test to apply a second predetermined voltage to the windings of the second stator assembly; and, means for measuring the current flowing through the windings of the second stator assembly as a result of the second predetermined applied voltage, the bonding control means controlling the second wiring bonding operation of the windings of the second stator assembly, said control means calculating the resistance in the windings of the second stator assembly as a result of the second predetermined applied voltage and measured current, and for adjusting the second predetermined applied voltage to a desired level at which a second predetermined current flows through the windings of the second stator assembly to heat the windings to a temperature at which a temperature activated adhesive material applied to the wires is activated, the material, when so activated, bonding the wires of the second stator assembly windings together.

11. The apparatus of claim 10 wherein the control means controls operation of the apparatus such that a surge test is being performed on one stator assembly simultaneously with a bonding operation being performed on another stator assembly whose windings have previously been successfully surge tested.

12. The apparatus of claim 1 wherein the measuring means includes a watt-amperage-voltage means which measures both the voltage supplied to the stator windings and the current flowing through the windings.

13. In apparatus for performing an electrical surge test on the windings of a stator assembly for a dynamoelectric machine, the windings being formed by coils of an electrical wire, the stator assembly being mounted in a fixture and ends of the stator windings being connected to electrical connectors for a voltage to be applied to the stator windings to perform a surge test, the improvement comprising means for bonding together the coils of electrical wire forming the windings of the stator assembly during a wiring bonding operation if the windings successfully pass the surge test, said means for bonding comprising:

power supply means responsive to an indication that the windings have successfully passed the surge test to apply a predetermined voltage to the stator windings, the stator assembly being retained in the fixture in which the assembly is installed for the surge test, and the same electrical connections between the stator windings and the apparatus being maintained;

means for measuring the current flowing through the stator windings as a result of the applied voltage; and, bonding control means controlling the wiring bonding operation, said bonding control means calculating the resistance in the windings as a result of the applied voltage and measured current, and for adjusting the applied voltage to a desired level at which a predetermined current flows through the windings to heat the windings to a temperature at which a temperature activated adhesive material applied to the wires is activated, the material, when so activated, bonding the wires together.

14. The improvement of claim 13 wherein the power supply means provides a specified voltage output, the control means including means for adjusting the voltage output of the power supply means applied to the stator windings, the adjustment means responding to the calculated winding resistance to adjust the power supply means voltage applied to the stator windings to a voltage which produces the predetermined current flow through the windings.

15. The improvement of claim 14 wherein the stator assembly includes a plurality of windings and the control means adjusts the applied voltage based upon the stator winding having the lowest calculated resistance.

16. The improvement of claim 15 wherein the power provides a three-phase AC voltage output, and includes variable transformer means for each phase, each variable transformer means having a tap controllable for the voltage developed across a variable transformer means to be at a desired voltage level, step-down transformer means to a stepped-down voltage, and rectifier means to which the voltage output of the respective step-down transformer is connected, the rectified voltage output of the rectifier means being the desired voltage supplied to the stator windings to produce the predetermined current flow through the windings.

17. The improvement of claim 16 wherein the electrical wire has a known temperature coefficient and the control means applies the desired voltage to the stator windings for a time interval sufficient for the wire temperature to increase to the temperature at which the adhesive material is activated, this interval being a function of the resistance of the wire and the temperature coefficient of the wire.

18. The improvement of claim 17 further including infrared sensing means for sensing the temperature of the wire.

19. The improvement of claim 18 wherein the apparatus further includes a second fixture on which a second stator assembly is installed for a separate surge test to be performed on the windings of the second stator assembly, the windings of the second stator assembly being electrically connected to the apparatus through electrical connectors which are different from the electrical connectors from which the first stator assembly windings are connected, the power supply means being responsive to an indication that the windings of the second stator assembly have successfully passed a separate surge test to apply a second predetermined voltage to the windings of the second stator assembly; and the improvement further comprising means for measuring the current flowing through the windings of the second stator assembly as a result of the second predetermined applied voltage, the bonding control means controlling the bonding operation of the windings of the second stator assembly, said control means calculating the resistance in the windings of the second stator assembly as a result of the second predetermined applied voltage and measured current, and for adjusting the second predetermined applied voltage to a desired level at which a second predetermined predetermined current flows through the windings of the second stator assembly to heat the windings to a temperature at which a temperature activated adhesive material applied to the wires is activated, the material, when so activated, bonding the wires of the second stator assembly windings together.

20. The improvement of claim 19 wherein the control means controls operation of the apparatus such that a surge test is being performed on one stator assembly simultaneously with a bonding operation being performed on another stator assembly whose windings have previously been successfully surge tested by the apparatus.

21. The improvement of claim 20 wherein the measuring means includes a watt-amp-voltage measuring means which measures both the voltage supplied to the stator windings and the current flowing through the windings.

22. The improvement of claim 21 further including a shunt resistor interposed in an electrical circuit with the stator windings, the watt-amp-voltage means being connected across the shunt resistor.

23. The improvement of claim 13 wherein the control means causes the wire forming the stator windings to be heated to a temperature of approximately 225° C.(437° F.).

24. A method of bonding together coils of an electrical wire forming windings of a stator assembly employed in the construction of a dynamoelectric machine, the method comprising:

installing the stator assembly in a fixture;

electrically connecting the stator windings to an energy source;

performing a surge test on the stator windings using electrical energy provided by said energy source and providing an indication if the surge test is successful;

electrically connecting the stator windings to a power supply means, the stator winding being connected to said power supply means using a common electrical connection with said energy source;

supplying said indication of a successful completion of the surge test to the power supply means, said power supply means being responsive to the indication that the windings have successfully passed the surge test to apply a predetermined voltage to the stator windings;

measuring the current flowing through the stator windings as a result of the applied voltage; calculating the resistance in the windings as a result of the applied voltage and measured current; and, adjusting the applied voltage from said power supply means to a desired level at which a predetermined current flows through the windings to heat the windings to a temperature at which a temperature activated adhesive material applied to the wires is activated, the material, when so activated, bonding the wires together.

25. The method of claim 24 further including sensing the temperature of the stator windings.

26. The method of claim 24 further including:

installing a second stator assembly in a second fixture;

electrically connecting the windings of the second stator assembly to said energy source and to said power supply means, performing a surge test on the windings of said second stator assembly and providing an indication if said surge test is successful;

supplying the indication of the successful completion of the surge test on said second stator assembly to said power supply means, said power supply means being responsive to said indication to apply a predetermined voltage to the windings of the second stator assembly;

measuring the current flowing through the windings of the second stator assembly as a result of the applied voltage;

calculating the resistance in the windings of the second stator assembly as a result of the applied voltage and measured current; and, adjusting the applied voltage to the windings of the second stator assembly to desired level at which a predetermined current flows through the windings of the second stator assembly to heat the windings to a temperature at which a temperature activated adhesive material applied to the wires is activated, the material, when so activated, bonding the wires of the second stator assembly windings together.

27. The method of claim 26 wherein a surge test is being performed on one stator assembly simultaneously with a bonding operation being performed on another stator assembly whose windings have previously been successfully surge tested.

28. Apparatus for bonding together coils of an electrical wire forming windings of a stator assembly employed in the construction of dynamoelectric machines, the apparatus comprising:

connector means for electrically connecting the electrical wire to the apparatus; and control means for controlling a winding bonding operation, said control means calculating an initial resistance in the electrical wire and selecting a voltage level at which to apply a predetermined current to the electric wire to heat the electric wire to a temperature at which a temperature activated adhesive material applied to the electrical wire is activated, the material, when so activated, bonding the coils of electrical wire together, and said control means being responsive to resistance fluctuations in the electrical wire indicative of shorts and faults during the application of said predetermined current.

29. The apparatus of claim 28 wherein the control means calculates the initial resistance in the electrical wire by applying a predetermined voltage to said electrical wire and measuring the resultant current flow.

30. The apparatus of claim 29 further including a testing means for applying a surge test to said electric wire and supplying an indication of successful completion of said surge test to said control means, the control means being responsive to said indication to calculate the resistance in the electric wire.

31. Apparatus for bonding together coils of an electrical wire forming windings of a stator assembly employed in the construction of dynamoelectric machines comprising:

connecting means for electrically connecting the electrical wire to the apparatus;

testing means for surge testing said electric wire through said connecting means and supplying an indication of successful completion of said surge test; and control means for controlling a winding bonding operation and responsive to said indication to calculate an initial resistance in the electric wire and select a voltage level at which to apply a predetermined current to the electric wire through said connecting means to heat the electric wire to a temperature at which a temperature activated adhesive material applied to the electrical wire is activated, the material, when so activated, bonding the coils of electrical wire together, said control means further responsive to resistance fluctuations in the electrical wire indicative of shorts and faults during the application of said predetermined current.

32. A method for bonding together coils of an electrical wire forming windings of a stator assembly employed in the construction of dynamoelectric machines, the method comprising the steps of:

electrically connecting the coils of electrical wire to an energy source;

applying a predetermined voltage from the energy source to the coils of electrical wire;

measuring the current in the coils of electrical wire resulting from the predetermined voltage;

calculating a resistance of the coils of electrical wire as a result of the predetermined voltage and measure current;

adjusting the applied voltage from the energy source to a desired level at which a temperature activated adhesive material applied to the coils of electrical wire is activated by resistance heating, the material, when so activated, bonding the coils of electrical wire together; and, monitoring the resistance of said coils of electrical wire during the resistance heating and responding to shorts and faults in the electrical wire to terminate the resistance heating.

33. The method of claim 32 further including the steps of:

surge testing said coils of electrical wire after connecting the coils to the energy source and before applying said predetermined voltage to said coils; and, supplying an indication of the successful completion of said surge testing to said energy source, said energy source being responsive to the indication that said coils have successfully passed the surge test to apply said voltage.

* * * * *